(12) United States Patent
Holcomb et al.

(10) Patent No.: US 7,076,920 B2
(45) Date of Patent: *Jul. 18, 2006

(54) METHOD OF USING A COMBINATION DIFFERENTIAL AND ABSOLUTE PRESSURE TRANSDUCER FOR CONTROLLING A LOAD LOCK

(75) Inventors: Garry Holcomb, Boulder, CO (US); Youfan Gu, Superior, CO (US); James Stafford, Golden, CO (US); James M. Mueller, Lafayette, CO (US); Stacy Wade, Boulder, CO (US)

(73) Assignee: MKS Instruments, Inc., Wilmington, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/815,376

(22) Filed: Mar. 21, 2001

(65) Prior Publication Data

US 2001/0029889 A1    Oct. 18, 2001

(51) Int. Cl.
*B65G 53/46*    (2006.01)
(52) U.S. Cl. .................. 49/506; 414/217; 414/221; 414/939
(58) Field of Classification Search ............. 414/217, 414/217.1, 221, 490, 939, 411; 49/506
See application file for complete search history.

(56) References Cited

U.S. PATENT DOCUMENTS

| | | | |
|---|---|---|---|
| 4,797,054 A * | 1/1989 | Arii ............................ 414/217 |
| 4,902,138 A | 2/1990 | Goeldner et al. |
| 4,943,457 A | 7/1990 | Davis et al. |
| 4,995,264 A * | 2/1991 | Stocker et al. ................ 73/702 |
| 5,129,348 A * | 7/1992 | Rannenberg et al. ........ 114/333 |
| 5,223,229 A * | 6/1993 | Brucker ....................... 422/116 |
| 5,259,211 A * | 11/1993 | Ikeda ......................... 62/228.4 |
| 5,347,869 A | 9/1994 | Shie et al. |
| 5,363,872 A | 11/1994 | Lorimer |
| 5,445,484 A * | 8/1995 | Kato et al. .................. 414/217 |
| 5,445,491 A * | 8/1995 | Nakagawa et al. ......... 414/805 |

(Continued)

FOREIGN PATENT DOCUMENTS

WO    WO 98/48168    10/1998

OTHER PUBLICATIONS

Stephen P. Hansen, Kathryn Whitenack; Pressure Measurement and Control in Loadlocks; Solid State Technology; Oct. 1997; 151-152, 154, 156, 158.

(Continued)

*Primary Examiner*—Gregory J. Strimbu
(74) *Attorney, Agent, or Firm*—Cochran Freund & Young LLC; James R. Young

(57) ABSTRACT

A pirani absolute pressure sensor for sensing absolute pressure in a load lock in a range from 100 to $10^{-4}$ torr and a differential pressure sensor for sensing a pressure difference between ambient atmospheric pressure and pressure in the load lock chamber are combined together in a module with a manifold and common circuit components to provide a pressure transducer that is capable of producing not only analog output for absolute pressure measurements, but also control signals at settable absolute and differential pressure values for opening interior and exterior doors of a load lock used to shuttle wafers and other devices into and out of a vacuum processing chamber. The transducer can also produce signals to control transition from slow to fast vacuum pumping of the load lock chamber at a settable threshold pressure.

37 Claims, 5 Drawing Sheets

U.S. PATENT DOCUMENTS

| | | | |
|---|---|---|---|
| 5,452,613 A | | 9/1995 | Bills et al. |
| 5,475,623 A | * | 12/1995 | Stocker .................... 702/98 |
| 5,557,972 A | | 9/1996 | Jacobs et al. |
| 5,611,655 A | * | 3/1997 | Fukasawa et al. .......... 414/217 |
| 5,902,932 A | | 5/1999 | Bills et al. |
| 6,018,932 A | * | 2/2000 | Eberhardt et al. ............ 53/432 |
| 6,064,311 A | * | 5/2000 | Ferenczi et al. ............ 340/618 |
| 6,186,722 B1 | * | 2/2001 | Shirai ........................ 414/217 |
| 6,250,869 B1 | * | 6/2001 | Kroeker .................... 414/221 |
| 6,470,754 B1 | * | 10/2002 | Gianchandani .............. 73/718 |

OTHER PUBLICATIONS

MKS Instruments; Baratron Vacuum, Atmospheric, and Pressure Switches; Bulletin 41/42/51/52; Feb. 1998.

MKS Instruments; Moducell Pirani ANalog Transducer; Bulletin Sep. 1999 series 325; 1999.

* cited by examiner

METHOD OF USING A COMBINATION DIFFERENTIAL AND ABSOLUTE PRESSURE TRANSDUCER FOR CONTROLLING A LOAD LOCK

BACKGROUND OF THE INVENTION

1. Field of the Invention

The present invention is related generally to load lock controls for vacuum processing chambers and more particularly to a combination differential and absolute pressure transducer for load lock control and a method of controlling load locks with such combination differential and absolute pressure transducer.

2. State of the Prior Art

Vacuum processing in reaction chambers is commonly used to deposit thin films of semiconductor materials, metal, dielectrics, and the like onto substrates in the fabrication of semiconductor devices. Typical processes that utilize such vacuum reaction chambers include chemical vapor deposition (CVD) and physical vapor deposition (PVD) and many variations of such processes, as well as etching processes to clean substrates or remove selected portions of materials. Typically, the vacuum process chamber is evacuated with a vacuum pump to a very low pressure, for example down to $10^{-4}$ torr, and, in some processes, much lower, such as $10^{-6}$ or even $10^{-7}$ torr. When the desired vacuum is attained, feed gases are flowed into the process chamber at desired rates and proportions to react and/or deposit desired materials onto substrate wafers. Heat may be used in some processes, but others are performed at room temperature. When deposition of the desired materials is complete, the wafer is removed from the process chamber and another substrate wafer is inserted into the process chamber, where the deposition process is repeated.

Significant vacuum pumping time is required to pump the process chamber down to the desired pressure, and undesirable contaminants enter the process chamber every time it is opened to atmosphere. Therefore, substantial efforts are made to avoid opening the process chamber to atmosphere and to maintain the process chamber pressure as close to the desired low deposition pressure as possible. Load locks are used, therefore, to facilitate insertion of substrates into the process chambers for deposition and/or etch processing and to remove the wafers from the process chamber while maintaining the vacuum in the process chamber.

A load lock is, essentially, a second vacuum chamber, often smaller in size than the process chamber, and connected to the process chamber by a passage with an interior "door" or large valve that can be opened for insertion and removal of the wafers into and out of the process chamber. When the interior door is closed, it seals the passage so that no air or gas can flow into or out of the process chamber through the passage. The load lock also has an exterior "door" or large valve, which opens the load lock chamber to the atmosphere to allow insertion or removal of wafers into and out of the load lock chamber. When the exterior door is closed, it seals the load lock so that no air or other gas can flow into or out of the load lock chamber.

In operation, the process chamber has its pressure maintained at the desired vacuum by a process chamber vacuum pump. With the interior door of the load lock closed, the exterior door is opened to the atmosphere, so one or more wafer substrate(s) can be inserted into the load lock chamber. With the wafer(s) in the load lock chamber, the exterior door is closed, and a load lock vacuum pump draws the air out of the load lock chamber, until the pressure in the load lock chamber is about as low as the pressure in the process chamber. Then, the interior door is opened, so the wafer substrate(s) can be moved from the load lock chamber, through the passage, and into the process chamber. When the wafer(s) are in the process chamber, the interior door can be closed while the wafer(s) are processed in the process chamber, i.e., while feed gas is fed into the process chamber and materials are either deposited on, or etched from, the wafer(s). Alternatively, but not preferably, the interior door could be left open during processing.

When the processing is complete, the wafer(s) are removed from the process chamber into the load lock chamber. The interior door is then closed to maintain the vacuum in the process chamber, while the pressure in the load lock is brought up to atmospheric pressure by allowing air or an inert gas, such as nitrogen, to flow into the load lock chamber. When the pressure in the load lock chamber is at or near atmospheric pressure, the exterior door is opened to allow removal of the processed wafer(s).

Some more complex process systems have a central transfer chamber with several process chambers branching out from the transfer chamber. In those circumstances, the load lock is usually connected by the passage and interior door to the transfer chamber.

In the past, it has been difficult to control the load lock in an efficient manner. Convection pirani pressure sensors, which have absolute pressure measuring capabilities from about 1,000 torr down to about $10^{-3}$ torr (atmospheric pressure at sea level is about 760 torr) have been used in pressure transducers adapted to control opening of the doors in load locks. Such control of load lock doors with that type of pressure transducer has been beneficial, but problems persist. For example, the $10^{-3}$ torr lower pressure measuring limit of the convection pirani sensors is not low enough for effective control of opening the interior door, because the process chambers are usually operated at pressures at least one to three orders of magnitude below that limit, i.e., at $10^{-4}$ torr or even $10^{-6}$ torr or lower. Thus, even when the load lock pressure is pumped down to $10^{-3}$ torr, opening the interior door causes an undesirable rush of gas molecules, along with any particulate impurities and water vapor they carry along, into the process chamber. It puts a greater load on the vacuum pumps of the process and/or load lock chambers, causing larger pump down times after each opening and closing of the interior door, especially in the process chamber to get the pressure pumped back down to the desired process pressure. Such added pumping overhead adds to the processing time and decreases efficiency.

The problems are even worse on the upper pressure end, i.e., at or near atmospheric pressure (about 760 torr), because density of gas or air molecules is much greater at that pressure than at the vacuum pressures used in vacuum process chambers. Thus, opening the exterior door when pressure inside the load lock chamber is not the same as the ambient atmospheric pressure causes much stronger air currents and is much more contaminating, even when the load lock is in a clean room. Again, convection pirani sensors do have accurate pressure sensing capabilities in the atmospheric range, but it is impossible to set them to control exterior door opening effectively due to constantly changing ambient atmospheric pressure conditions due to weather, altitude, and the like. For example, some manufacturers set the transducer to generate a signal to open the exterior door of the load lock when pressure of the load lock chamber is brought up to 750 torr, thinking it will work for most locations that are slightly above sea level. However, ambient atmospheric pressure in Boulder, Colorado, for example, is about 630 torr, so having a transducer that opens the exterior door when pressure in the load lock chamber reaches 750 torr in Boulder, Colo., would still have adverse gas current and contamination effects. Further, ambient atmospheric pressure at any geographic location varies, such as with different weather conditions or fronts that move into and out of any particular location. Resetting such transducers to generate control signals at different pressures is not easy, may require changing software or control circuits, and is not something that is done by ordinary users.

Therefore, there is a need for better transducer apparatus and for better control methods for controlling the exterior door openings, especially, and also for controlling interior door openings in load locks.

SUMMARY OF THE INVENTION

Accordingly, it is a general object of this invention to improve pressure monitoring and control of load locks in semiconductor fabrication process.

Another general object of this invention is to reduce contamination problems during load lock operations.

A more specific object of this invention is to provide controls that facilitate opening and closing the interior and exterior doors in load lock operations.

Another more specific object of this invention is to provide a pressure transducer for load lock control that is accurate and functional over the full range of operation from atmospheric pressures to very low evacuation pressures of $10^{-4}$ or lower.

Additional objects, advantages, and novel features of the invention shall be set forth in part in the description that follows, and in part will become apparent to those skilled in the art upon examination of the following or may be learned by the practice of the invention. The objects and the advantages may be realized and attained by means of the instrumentalities and in combinations particularly pointed out in the appended claims.

To achieve the foregoing and other objects, the apparatus of the present invention may comprise, but is not limited to, a combination differential and absolute pressure transducer apparatus for controlling a load lock that facilitates transfer of parts between a room at ambient atmospheric pressure and a vacuum processing chamber maintained at a pressure less than one (1) torr and that has an evacuatable load lock chamber, an exterior door positioned between the load lock chamber and the room, a interior door positioned between the load lock chamber and the processing chamber, a exterior door actuator that is responsive to an exterior door control signal to open or close the exterior door, an interior door actuator that is responsive to an interior door control signal to open or close the interior door, and a vacuum pump connected to the load lock chamber for evacuating the load lock chamber. The combination differential and absolute pressure transducer has a differential pressure sensor that is capable of sensing a pressure difference between ambient atmospheric pressure in the room and pressure in the load lock chamber, and it has an absolute pressure sensor that is capable of sensing absolute pressure in the load lock chamber. The differential pressure sensor is mounted so that a first side of the differential pressure sensor is exposed to ambient atmospheric pressure in the room and so that a second side of the differential pressure is exposed to pressure in the load lock chamber. The absolute pressure sensor is also mounted so that it is exposed to pressure in the load lock chamber. Both the differential pressure sensor and the absolute pressure sensor can be connected in fluid flow relation to the load lock chamber by a common manifold. A differential pressure transducer circuit is connected to the differential pressure sensor and is capable of generating an exterior door control signal at a preset differential pressure value, and an absolute pressure transducer circuit is connected to the absolute pressure sensor and is capable of generating an interior door control signal at a preset absolute pressure value. An exterior door control link connected between the differential pressure transducer circuit and the exterior door is capable of delivering exterior door control signals generated by the differential pressure transducer circuit to the exterior door actuator; an interior door control link connected between the absolute pressure transducer and the interior door is capable of delivering interior door control signals generated by the absolute pressure transducer circuit to the interior door actuator. These links can be any of a variety of devices for transmitting signal, such as a wire or wires, infrared transmitter and receiver, and the like, and can include appropriate input/output components, amplifiers, and other devices as would be understood by persons skilled in the art, once they understand the principles of this invention.

The absolute pressure sensor preferably comprises a pirani sensor with a resistivity that varies as a function of the pressure in the load lock chamber, and the absolute pressure transducer circuit can include a pirani bridge circuit that incorporates the pirani sensor as a resistive element in the bridge circuit. An analog process circuit connected to the pirani bridge circuit adjusts voltage across the pirani sensor as pressure in the load lock chamber varies and thereby keeps the bridge circuit in balance. A relay control circuit monitors voltage across the pirani sensor and generates the interior door control signal when the voltage across the pirani sensor is at a value that corresponds with the preset absolute pressure value.

The differential pressure preferably comprises a capacitance manometer pressure sensor in which a diaphragm is positioned with the load lock chamber pressure on one side of the diaphragm and ambient atmospheric pressure of the room on another side of the diaphragm so that the diaphragm flexes one way or the other, with the direction and magnitude of such flexing dependent on the direction and magnitude of the differential pressure across the diaphragm. Capacitance between the diaphragm and an adjacent plate varies as a function of differential pressure across a diaphragm. A sensor control circuit, converts the capacitance to a voltage that corresponds in value to the magnitude of the differential pressure across the diaphragm. A relay control circuit monitors the voltage from the sensor control circuit and generates the exterior door control signal when the voltage of the sensor control circuit corresponds with the preset differential pressure value.

To further achieve the foregoing and other objects, the invention may also comprise, but is not limited to, a method of automatically controlling such a load lock, including predetermining both a desired differential pressure value at which to open the external door and a desired absolute pressure value at which to open the internal door. The method then includes sensing actual differential pressure between the load lock chamber and the ambient pressure in the room, comparing the actual differential pressure to the predetermined differential pressure value, and, when the actual differential pressure equals the predetermined differential pressure value, producing and delivering an exterior door control signal to the exterior door actuator. The method also includes sensing actual absolute pressure in the load lock chamber, comparing the actual absolute pressure to the predetermined absolute pressure value, and, when the actual absolute pressure equals the predetermined absolute pressure value, producing and delivering an interior door control signal to the interior door actuator.

The method of this invention may also comprise, but is not limited to, transducing the sensed differential pressure to a voltage that is indicative of, or corresponds in value to, the sensed differential pressure, producing a differential pressure reference voltage that corresponds in value to the voltage that is transduced from the differential pressure when the differential pressure is at a desired differential pressure value for opening the exterior door, comparing the differential pressure reference voltage to such transduced voltage, and, when the transduced voltage equals the differential pressure reference voltage, producing and delivering the exterior door control signal to the exterior door actuator. This method may further include transducing the sensed absolute pressure to a voltage that is indicative of, or corresponds in value to, the absolute pressure, producing an absolute pressure reference voltage that corresponds in value to the voltage that is transduced from the absolute pressure when the absolute pressure is at a desired absolute pressure for opening the interior door, comparing the absolute pressure reference voltage to such transduced voltage, and, when the transduced voltage equals the absolute pressure reference voltage, producing and delivering the exterior door control signal to the interior door actuator.

BRIEF DESCRIPTION OF THE DRAWINGS

The accompanying drawings, which are incorporated in and form a part of the specification, illustrate the preferred embodiments of the present invention, and together with the descriptions serve to explain the principles of the invention.

In the Drawings.

DETAILED DESCRIPTION OF THE PREFERRED EMBODIMENTS

Figure 1:
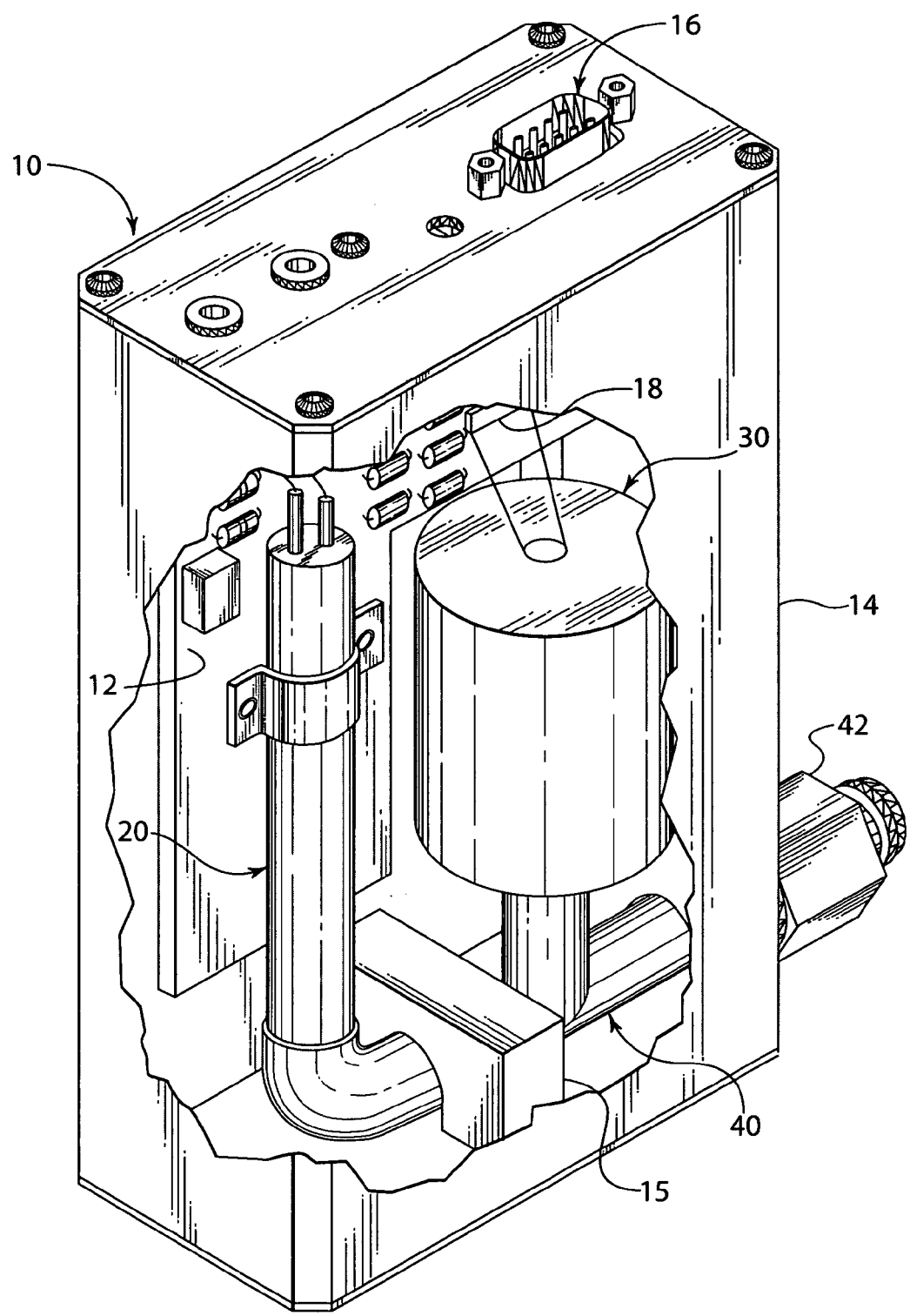
FIG. 1 is a perspective view of the combination differential and absolute pressure transducer of this invention.

The combination differential and absolute pressure transducer 10 according to this invention is shown in FIG. 1. In general, it comprises an absolute pressure sensor 20 and a differential pressure sensor 30, each of which is connected in gas flow relationship to a common manifold 40. The manifold 40 has a connector 42, such as a pipe fitting, for connecting the manifold 40 to a load lock chamber, which will be discussed below. A circuit board 12 with signal processing and control circuitry, which will be discussed in more detail below, is shown mounted to the absolute pressure sensor 20. A housing 14 containing the absolute pressure sensor 20 and differential pressure sensor 30 is fastened by a mounting block 15 to the manifold 40. A J1 connector 16 is provided in the housing 14 to accommodate connecting the circuit board 12 to an outside power source, to control actuators (not shown) for the load lock doors (discussed below), and the like. A J2 connector 18 is used to connect the differential pressure output signals to circuit board 12 components.

Figure 2:
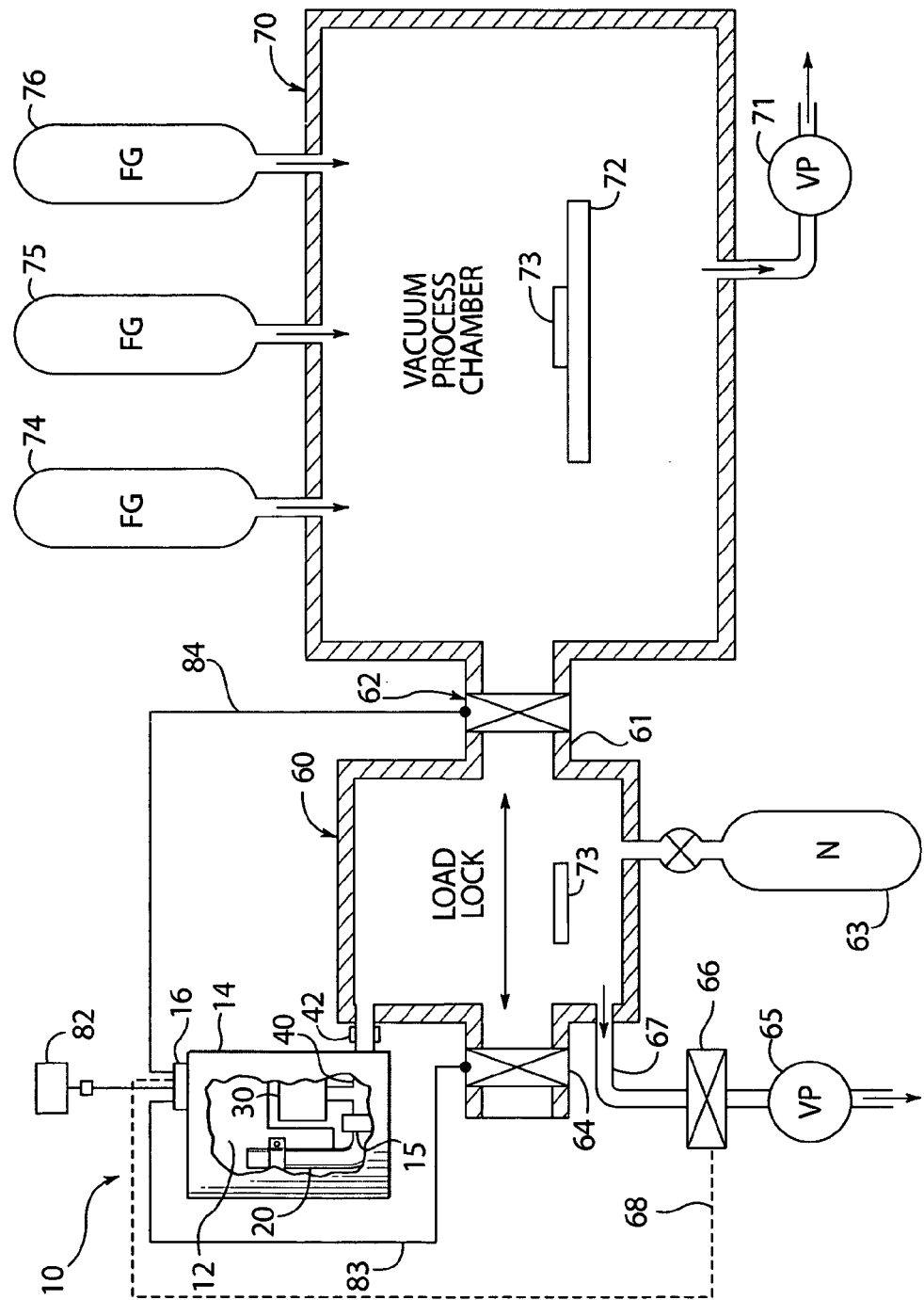
FIG. 2 is a diagrammatic view of a process chamber equipped with a load lock and illustrating the use of the combination differential and absolute pressure transducer of this invention with the load lock.

Referring now to FIG. 2 in combination with FIG. 1, a load lock 60 is shown connected to a vacuum processing chamber 70 by a passage 61 with an interior door 62. The processing chamber 70 has a vacuum pump 71 to maintain a vacuum, usually in the range of about 1 to $10^{-8}$ torr. A platform 72 is usually provided to support one or more wafers 73 during processing, such as deposition of semiconductor thin films derived from feed gas sources 74, 75, 76. The load lock 60 also has a vacuum pump 65 to pump down pressure in the load lock chamber 60. A source of gas 63, such as nitrogen, or sometimes air, is used to bring the pressure in the load lock chamber 60 back up to ambient, so the exterior door 64 can be opened to remove and/or insert a wafer 73 from and/or into the load lock chamber 60.

The combination differential and absolute pressure transducer 10 is shown connected in fluid-flow relation to the load lock chamber 60, so that the manifold 40, thus also the absolute pressure sensor 20 and the differential pressure sensor 30, are effectively at the same pressure as the load lock chamber 60. An outside electric power source 82 is shown connected to the circuit board 12 via the J1 connector 16. A process control link 83 between the circuit board 12 and the exterior door 64, via the J1 connector 16, carries control signals from the electric circuit 80 (shown in FIG. 6) to a suitable actuator (not shown) or actuator circuit (not shown), such as a solenoid or motor actuator (not shown) to control opening and/or closing the exterior door 64. Such actuators or actuator circuits for opening and/or closing exterior doors 64 on load lock chambers and how a control signal or signals can be used to operate such actuators or actuator circuits are well-known to persons skilled in the art and need not be described here for an understanding or enablement of this invention. A process control link 84 between the circuit board 12 and the interior door 62, via the J1 connector 16, carries control signals from the electric circuit (shown in FIG. 6) to a suitable actuator (not shown) or actuator circuit (not shown), such as a solenoid or motor actuator (not shown) to control opening and/or closing the interior door 62. Again, such actuators or actuator circuits for opening and/or closing an interior door 62 of a load lock chamber and how a control signal or signals can be used to operate such actuators or actuator circuits are well-known to persons skilled in the art and need not be described here for understanding or enablement of this invention. Another optional process control link 68, shown in broken lines, can be used to control the effective pumping speed of the vacuum pump 65 by controlling a throttle valve 66. By partially closing the throttle valve 66 and thereby slowing down the effective pumping speed, turbulence is reduced in the pumping line 67 and in the load lock chamber 60, thus reducing the particle contamination inside the load lock chamber 60 from particles and contaminants that could otherwise be stirred up in the pumping line 67 and load lock chamber 60. When the load lock chamber 60 is evacuated and most of the air or gases are removed, turbulence is not so much of a problem. Therefore, when the vacuum in the load lock chamber 60 gets pumped down to a certain threshold pressure, the process control link can be used to re-open the throttle valve 66, thereby stepping the effective pumping speed of the vacuum pump 65 up to full speed.

The process control links 68, 83, and 84 can be any type of components or devices that are known in the art for transmitting signals from one component to another. For example, they can include simple wire conductors, infra-red transmitters and receivers, any associated input/output components, amplifiers, and the like, as would be understood by persons skilled in the art.

Figure 3:
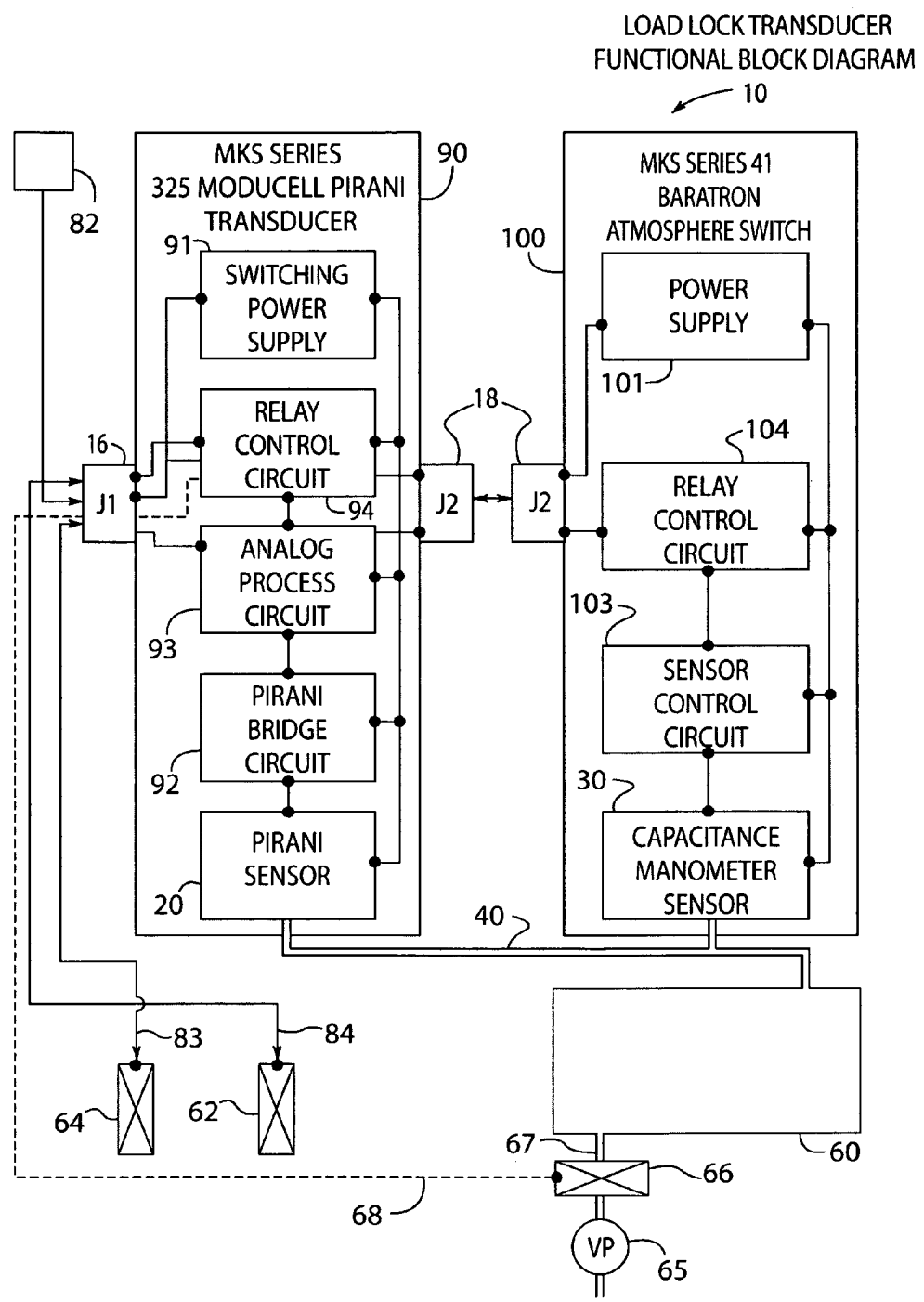
FIG. 3 is a function block diagram of the combination differential and absolute pressure transducer of this invention.

As illustrated in the function block diagram in FIG. 3, a power supply 91 for the absolute pressure transducer function 90 and a power supply 101 for the differential pressure transducer function 100 are connected to an external power source 82. In the absolute pressure transducer function 90, the absolute pressure sensor 20, such as a standard pirani sensor, which can sense absolute pressure accurately from about 100 torr down to about $10^{-4}$ torr, senses pressure in the load lock chamber 60. A pirani bridge circuit 92 produces a voltage signal that is indicative of the absolute pressure sensed by the pirani sensor 20. An analog process circuit 93 drives the bridge circuit 92 and amplifies and conditions the voltage signal from the bridge circuit 92. The relay control circuit 94 utilizes the voltage signal from the process circuit 93 to generate control signals to the interior door 62 actuator to open the door 62 when the pressure in the load lock chamber 60 reaches a certain minimum pressure to match or at least get close to the pressure at which the process chamber 70 (FIG. 2) is operated. Alternatively, the control signal from relay control circuit 93 can be used to prevent the interior door 62 from being opened until the minimum threshold pressure in the load lock chamber 60 is reached. Also, as mentioned above, the relay control circuit 94 can also be configured to output a control signal to the throttle valve 66 controller (not shown) to speed up the vacuum pump 65 when the pressure in the load lock chamber gets pumped down to some selected intermediate pressure threshold so as to keep gas flow in the load lock chamber 60 to a minimum during pump down of the load lock chamber 60 when pressure is relatively high. Other absolute pressure sensors could also be used in this invention instead of the pirani sensor 20 described.

The differential pressure transducer function 100 shows the differential pressure sensor 30, which can be, for example, a capacitance manometer pressure sensor. The differential pressure sensor 30, senses differential pressure between the ambient atmospheric pressure and the pressure in the load lock chamber 60, as will be explained in more detail below. The capacitance manometer sensor 30 has a capacitance that varies as a function of the pressure difference between the atmospheric pressure and the load lock chamber 60 pressure, as will be explained in more detail below. The sensor control circuit 103 senses the capacitance of the capacitance manometer sensor 30 and converts the capacitance variance into a voltage signal that is indicative of the pressure differential. The relay control circuit 104 utilizes the voltage signal from the sensor control circuit 103 to output a control signal to the exterior door 64 actuator to either open the exterior door 64 when a certain pressure differential is reached or to prevent the exterior door 64 from opening until a certain pressure differential is reached. For example, the exterior door 64 could be opened when the differential pressure between the atmosphere and the load lock chamber 60 is zero, i.e., when the load lock chamber 60 pressure and the atmospheric pressure are equal. At such zero differential pressure, there would be very little, if any, flow of air or gas (other than diffusion) either into or out of the load lock chamber 60 when the exterior door 64 is opened. Of course, the relay control circuit 104 could be set to output a control signal at a differential pressure other than zero, if desired.

Figure 4:
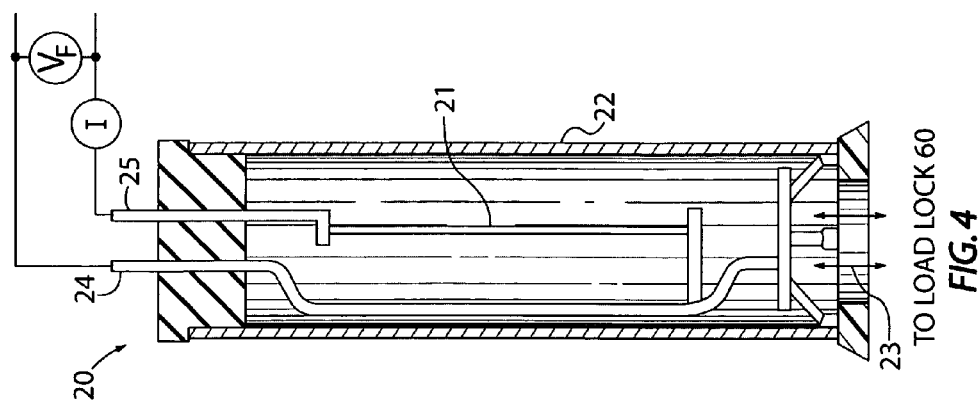
FIG. 4 is a vertical cross-sectional view of a convection pirani pressure sensor used to implement this invention.

An example pirani absolute pressure sensor 20 is shown in FIG. 4. The pirani sensor 20 comprises a filament 21 enclosed by a tubular container 22, which is connected to the load lock chamber 60 via the manifold 40 (not shown in FIG. 4, but indicated by arrow 23). Therefore, the density of gas molecules in the tubular container 22 and surrounding the filament 21 is substantially the same as the density of gas molecules in the load lock chamber 60, which increases as pressure rises and decreases as pressure lowers, An electric current I running through the filament 21 heats the filament 21, and heat dissipation from the filament 21 is a function of the gas density in the tubular container 22 surrounding the filament 21. Specifically, the current I required to maintain the filament 21 at a constant temperature is directly relative to the thermal conductivity and pressure of the gases present in the tubular container 22, thus in the load lock chamber 60. Therefore, as pressure decreases, the voltage $V_F$ across the filament 21 has to be decreased in order to maintain a constant filament 21 temperature. Conversely, as pressure in the load lock chamber 60, thus in the tubular container 22, increases, the voltage VF required to maintain the filament 21 at a constant temperature increases. The electric leads 24, 25 of the pirani sensor 20 are connected to the bridge circuit 92 (shown in FIGS. 3 and 6), which, along with a bridge driver circuit in the analog processing circuit 93 (FIGS. 3 and 6), adjust the voltage $V_F$ as required to maintain the filament 21 at a constant temperature as the pressure in the tubular container 22 thus load lock chamber 60, varies up or down. The voltage $V_F$, therefore, is indicative of the absolute pressure in the tubular container 22, thus of the absolute pressure in the load lock chamber 60, within a range of about 100 torr to $10^{-4}$ torr, as mentioned above. Thus, this voltage $V_F$ can be used by the relay control circuit 94 (FIGS. 3 and 6) to generate and output a signal via process control link 84 at a particular voltage $V_F$, i.e., at a particular pressure in the load lock chamber 60, to the interior door 62 actuator to open the door 62 or to allow interior door 62 to be opened.

As mentioned above, this invention could be implemented with other kinds of absolute pressure sensors in place of the pirani sensor 20 describe above, such as a thermocouple sensor (not shown) or a convection pirani sensor (not shown). However, the regular pirani sensor 20 described above has advantages in this application. For example, the regular pirani sensor 20 described above is more accurate than a thermocouple sensor, measures over a wider pressure range, and responds more rapidly to pressure changes. A convection pirani sensor is similar to the regular pirani sensor 20 described above, but has a larger tubular container to accommodate gas convection currents around the filament. The gas convection currents increase the range of measurement in higher pressures, but has little effect at lower pressures. For example, where a regular pirani sensor 20 has an accurate pressure measurement range of about 100 torr down to $10^{-4}$ torr, a convection pirani sensor has a range of about 1,000 torr down to $10^{-3}$ torr. In the present invention, the lower measurement range of the regular pirani sensor 20, i.e., down to about $10^{-4}$ torr, is more important than the higher measurement range of a convection pirani sensor, because the present invention takes care of the higher pressure range control of the exterior door 64 in a different way, as explained below.

Specifically, to avoid problems associated with use of an absolute pressure transducer for controlling the exterior door 64, such as variations of atmospheric pressure at different altitudes and by changing weather patterns, which cause increased risk of contamination of the load lock chamber 60 with each opening of the exterior door 64, thus eventual contamination of the process chamber 70 with subsequent opening of the interior door 62, the pressure transducer 10 of the present invention has a differential pressure sensor 30 for controlling the exterior door 64 opening. Therefore, the higher absolute pressure measuring capability of a convection pirani sensor, i.e., up to 1,000 torr, is not needed.

There are many types of differential pressure sensors, as is well-known in the art, many of which could be used with this invention, including, but not limited to, piezo pressure sensors. However, a particularly useful differential pressure sensor 30 for this application is a capacitance manometer pressure sensor, because it is relatively simple, durable, and very accurate. As mentioned above, atmospheric pressure at sea level is about 760 torr, which varies with weather patterns, and atmospheric pressures at higher elevation locations are significantly lower than 760 torr, such as about 630 torr in Boulder, Colo., which also vary with weather patterns. Therefore, any setting of a particular absolute pressure for opening the exterior door hardly ever matches actual ambient atmospheric pressure, thus almost invariably cannot avoid an air inrush or outrush into or out of the load lock chamber 60 upon opening of the exterior door 64.

In contrast, the differential pressure sensor 30 can generate a control signal to open the exterior door 64, or to allow exterior door 64 to be opened, only when the pressure in the load lock chamber 60 equals the ambient atmospheric pressure, regardless of what such ambient atmospheric pressure may be at any particular time or at any particular location or elevation. Thus, the regular pirani pressure sensor 20 described above enables accurate and effective opening of interior door 62 at specific absolute pressures in the load lock chamber 60 down to $10^{-4}$ torr to match, or at least get reasonably close to, the absolute pressure being maintained in the process chamber 70, which is quite constant and known during processing, while the differential pressure sensor 30 enables accurate and effective opening of the exterior door 64 when the load lock chamber 60 pressure matches the ambient atmospheric pressure, regardless of variations of ambient atmospheric pressure from time to time and from one location to another.

Figure 5:
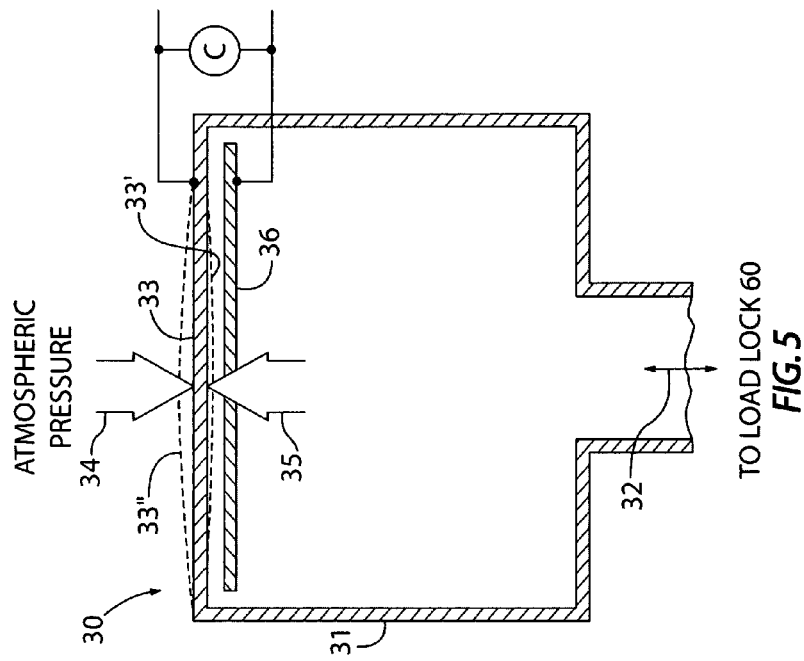
FIG. 5 is a diagrammatic cross-sectional view of a differential pressure sensor use to implement this invention.

A diagrammatic representation of a capacitance manometer differential pressure sensor 30 in cross-section is shown in FIG. 5. Essentially, an enclosed manometer chamber 31 is connected in fluid flow relation to the load lock chamber 60 via the manifold 40 (FIGS. 1 and 3) as indicated by arrow 32, so that the pressure in the manometer chamber 31 is substantially the same as the pressure in the load lock chamber 60. One wall 33 of the manometer chamber 31 is thin enough to flex or deform as a diaphragm, as indicated by broken line 33', when atmospheric pressure, indicated by arrow 34, is greater than pressure in the manometer chamber 31, which is indicated by arrow 35. If the atmospheric pressure 34 is equal to the manometer chamber 31 pressure 35, then there will be no flexure or deformation 33' of the wall or diaphragm 33. If the atmospheric pressure 34 is less than the manometer chamber 31 pressure 35, the thin wall or diaphragm 33 will flex outwardly, as indicated by broken line 33". The extent of flexure of deformation 33' or 33" is proportional to the magnitudes of pressure differential between atmospheric pressure 34 and manometer chamber 31 pressure 35. Therefore, measurement of the amount of flexure 33', 33", is indicative of pressure differential between atmospheric pressure 34 and manometer chamber 31 pressure 35.

There are many ways to detect and measure the amount of flexure 33', 33", such as with strain gauges, optically, and others that are well-known to persons skilled in the art. In the case of the capacitance manometer sensor 30 illustrated in FIG. 5, the flexure 33', 33" of the wall or diaphragm 33 is measured by detecting capacitance between the wall or diaphragm 33 and an adjacent metal plate 36. As is well known in the art, two metal plates, such as the metal wall or diaphragm 33 and the plate 36, when separated by a dielectric or an empty space, have a capacitance C when a voltage is applied between them across the dielectric or empty space and that the capacitance C changes when the distance between the plates changes. Therefore, as the differential pressure across the diaphragm 33 causes the diaphragm 33 to flex, either as indicated by 33' or 33", the distance between the diaphragm 33 and the plate 36 changes, and such distance changes result in capacitance C changes. Therefore, the capacitance C between the diaphragm 33 and the plate 36 is indicative of, and corresponds to, the differential pressure across the diaphragm 33. Persons skilled in the art also know how to measure capacitances C and changes in capacitance C with a sensor control circuit 103 (FIG. 3), since it is well-known that capacitance C is a function of voltage potential between the plate 36 and diaphragm 33 and that such voltage is easy to measure and control. Such capacitance manometers 30 are well-known and readily available to persons skilled in the art. Therefore, the differential pressure between the load lock chamber 60 pressure 35 and the ambient atmospheric pressure 34, if any, can be measured by measuring the capacitance C between the wall or diaphragm 33 and the plate 36. As mentioned above, the sensor control circuit 103 can be configured to produce a voltage that is indicative of, or that corresponds to, the capacitance C, thus is also indicative of, or corresponds to, the differential pressure, and such voltage is used by the relay control circuit 104 (FIG. 3) to generate and output a signal via process control link 83 when such voltage corresponds to a preset differential pressure, e.g., when the differential pressure is zero (no flexure 33'or 33" in FIG. 5) to open the exterior door 64 or to allow exterior door 64 to be opened. For example, but not for limitation, a constant reference voltage can be produced and preset to correspond with the voltage output that would be produced by the sensor control circuit 103 when the differential pressure is at the desired value for opening the exterior door 64. Then, a common voltage comparator circuit can be used to compare the actual voltage produced by the sensor control circuit 103 with the reference voltage to actuate a relay and generate the exterior door control signal on control link 83 when the actual voltage from the sensor control circuit 103 matches the reference voltage. Of course, persons skilled in the art will also understand that such comparison of pressure, capacitance C, or voltage values to trigger generation of the exterior door control signals can be accomplished in myriad ways with analog or digital signal processing, software, and the like. The relay control circuit 104 could also be set to generate and output such a control signal to exterior door 64 when the differential pressure is some desired discrete amount more or less then zero, for example, by setting the reference voltage described above to correspond with the voltage produced by the control circuit 103 at such discrete differential pressure.

Thus, it does not matter in this invention what the specific load lock chamber 60 absolute pressure 35 is or what the particular ambient atmospheric pressure 34 is. When the differential pressure between them is some specific amount, such as zero or some other desired set value, the exterior door 64 will open or be allowed to open.

Figure 6:
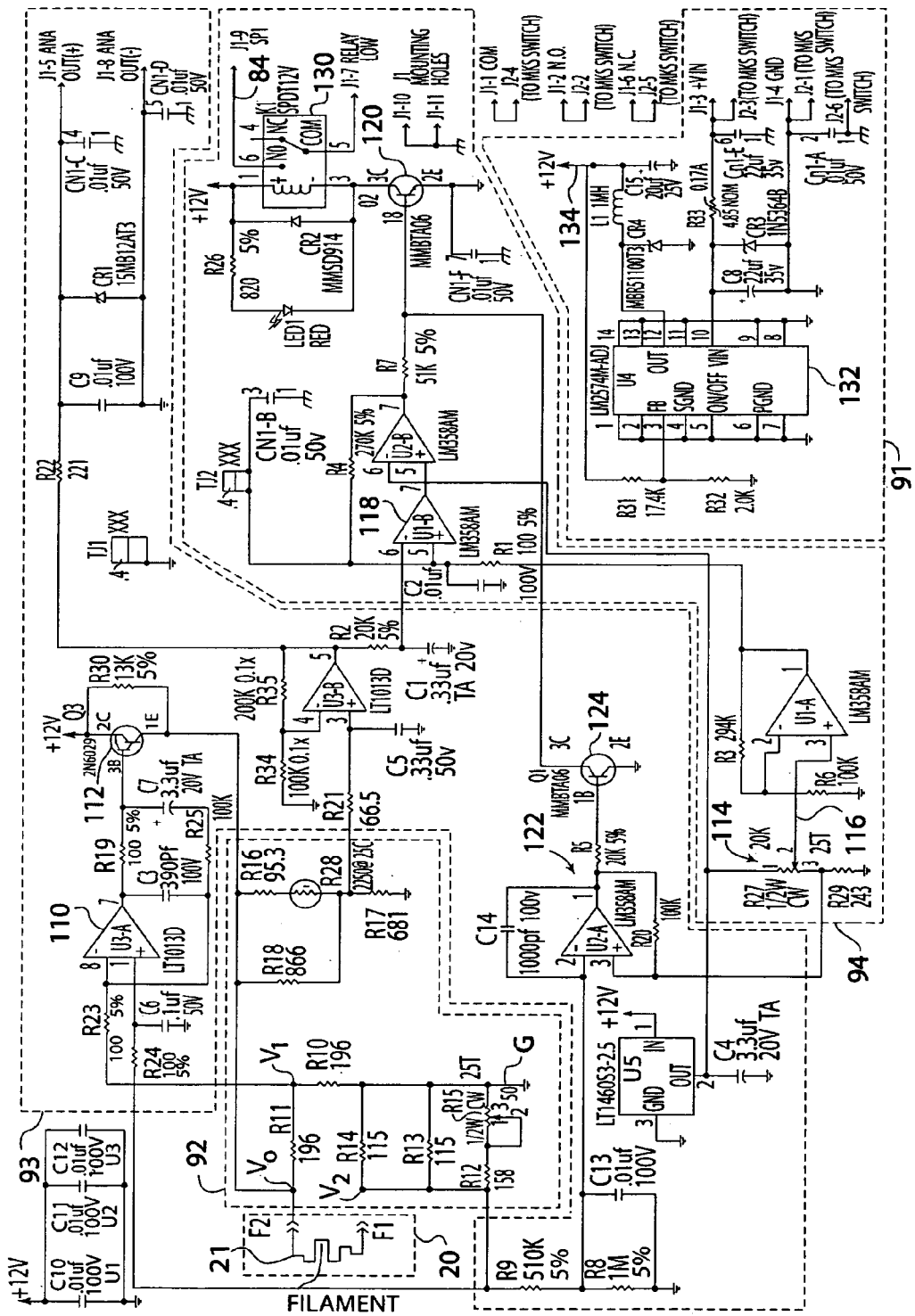
FIG. 6 is an electric circuit diagram of an electric circuit used to implement this invention.

A schematic diagram of the electric circuit on the circuit board 12 (FIGS. 1 and 2) is shown in FIG. 6 with the portions of the circuit that comprise pirani sensor 20, pirani bridge circuit 92, analog process circuit 93, relay control circuit 94, and switching power supply 91 outlined with broken lines. Persons skilled in the art will readily understand this electric circuit from the functions and features described, but several salient features can be mentioned. The basic Wheatstone bridge comprises essentially, the pirani filament 21 between voltage nodes $V_0$ and $V_2$, the resistor R11 between voltage nodes $V_0$ and $V_1$, the resistor R10 between voltage node $V_1$ and ground node G, and the parallel resistors R12, R13, R14, and R15 between the voltage node $V_2$ and the ground node G. As pressure in the load lock chamber 60 (FIGS. 2 and 3), thus gas pressure around the filament 21, decreases, conduction of heat by gas molecules from the filament 21 decreases. Decrease in heat dissipation from the filament 21 would, in the absence of an adjustment, cause temperature of the filament 21, thus resistance of the filament 21, to increase. An increase in resistance of the filament 21 would change current flow in the bridge circuit 92 and cause the bridge voltages $V_1$ and $V_2$ to become unbalanced, i.e., $V_1$ would not equal $V_2$, which is detected by a voltage comparator 110 in the analog process circuit 93. In response, the transistor controller 112 in the analog process circuit 93 lowers the voltage $V_0$ in the bridge circuit 92, which lowers the voltage $V_F$ across the filament 21, thus lowers current flow I through the filament 121. The lower current I in filament 21, lowers heat production in the filament 21, because production of heat requires power, and power equals $I^2R$. Less heat production means temperature of the filament 21 comes back down, thus resistance of the filament 21 comes back down, which readjusts current flow in the bridge circuit 92 back in balance, i.e., $V_1 = V_2$ again. Conversely, when load lock chamber 60 pressure, thus pressure around the filament 21, increases, more gas molecules conduct more heat away from the filament 21, which, in the absence of an adjustment, would lower temperature, thus resistance, of the filament 21. Lower resistance in filament 21 would change current flow in the bridge circuit 92, thus causing the bridge circuit 92 to become unbalanced, i.e., $V_1$ would not equal $V_2$. Again, such imbalance is detected by the voltage comparator circuit 110, which causes the transistor controller 112 to increase $V_0$. The increased $V_0$ increases $V_F$ across the filament to increase current I in the filament, which increases power ($I^2R$) to raise the temperature, thus resistance, of filament 21, to put the bridge circuit 92 back into balance, i.e., $V_1 = V_2$. Consequently, with these adjustments of the voltage $V_0$, the temperature of the filament 21 is kept constant. Further, such decreases and increases of the voltage $V_0$ required to maintain the filament 21 temperature constant, as explained above, are indicative of changes in load lock chamber 60 pressure. Thus, the voltage $V_0$ can be monitored electronically and used to actuate the relay control circuit 94 to generate and output a control signal on link 84 (FIGS. 2 and 3) to open the interior door 62, or to allow the interior door 62 to be opened, at some selected minimum load lock chamber 60 pressure level that matches or is near the pressure maintained in the process chamber 70. Optionally, as mentioned above, the voltage $V_0$ could also be used to actuate the relay control circuit 94 or another relay control circuit (not shown) to generate and output a control signal on link 68 to the throttle valve 66 (FIGS. 2 and 3) to increase the effective pumping speed of the vacuum pump 65 after the load lock chamber 60 pressure is drawn down to some desired intermediate load lock chamber 60 pressure threshold.

A potentiometer 114 in the relay control circuit 94 is used to set the voltage level at which $V_0$ will actuate a transistor 120 to actuate the relay 130 to generate the control signal on link 84 (FIGS. 2 and 3) to open the inner door 62 or to allow the inner door 62 to be opened (optionally to increase speed of the vacuum pump 65). A voltage comparator 118 compares $V_0$ from the analog process circuit 93 to a voltage on lead 116 set by the potentiometer 114 to actuate the switch 120, thus actuating the relay 130. A failsafe circuit 122 also monitors the bridge voltage, such as $V_2$, and, if it is not within a proper range or level, such as would happen if the filament 21 would break, a transistor switch 124 is actuated to prevent the relay 130 from being actuated.

The switching power supply 91 provides power at 134 for the pirani sensor 20, the bridge circuit 92, the analog processing circuit 93, and relay control circuit 134. The J1 and J2 pins marked "TO MKS SWITCH" in FIG. 6 show the connections of the capacitance manometer 30 (FIGS. 1 and 4) to the circuit board 12 (FIG. 1). Since, as mentioned above, capacitance manometers that can be set to trip at pressures in relation to atmospheric pressure have been well-known and available commercially for many years (e.g., BARATRON™ Atmospheric Switches manufactured by MKS Instruments, Inc., Andover, Mass. 01810-2449), a detailed description of power supply 101, sensor control circuit 103, or relay control circuit 104 shown in the function block diagram of FIG. 3 is not necessary to the understanding or implementation of this invention.

The foregoing description is considered as illustrative only of the principles of the invention. Furthermore, since numerous modifications and changes will readily occur to those skilled in the art, it is not desired to limit the invention to the exact construction and process shown and described above. Accordingly, resort may be made to all suitable modifications and equivalents that fall within the scope of the invention. The words "comprise," "comprises," "comprising," "include," "including," and "includes" when used in this specification are intended to specify the presence of stated features, integers, components, or steps, but they do not preclude the presence or addition of one or more other features, integers, components, steps, or groups thereof. The term "about", when used in relation to pressure, means within a range of plus or minus 100 torr.

The embodiments of the invention in which an exclusive property or privilege is claimed are defined, as follows:

1. A method of automatically controlling a load lock that facilitates transfer of parts between a room at ambient atmospheric pressure and a vacuum transfer or processing chamber maintained at a pressure less than one torr and that has an evacuatable load lock chamber, an exterior door positioned between the load lock chamber and the room, a interior door positioned between the load lock chamber and the transfer or processing chamber, a exterior door actuator that is responsive to an exterior door control signal to open or close the exterior door, an interior door actuator that is responsive to an interior door control signal to open or close the interior door, and a vacuum pump connected to the load lock chamber for evacuating the load lock chamber, comprising:

providing a modular differential and absolute pressure transducer that includes a housing, which contains a pirani pressure sensor, a differential pressure sensor, and a control circuit, with both of the sensors being in fluid flow relation to a manifold and the pirani pressure sensor being capable of measuring absolute pressure at least in a range of 100 torr to $10^{31\ 4}$ torr;

connecting the pressure transducer via one fluid flow connection of the manifold to the load lock chamber to expose both said pirani pressure sensor and said differential pressure sensor to pressure in the load lock chamber via said one fluid flow connection so that said modular differential and absolute pressure transducer senses and transduces said pressure in the load lock chamber to a first voltage that is indicative of the pressure in the load lock chamber and senses and transduces a differential pressure between the pressure in the load lock chamber and the ambient atmospheric pressure to a second voltage that is indicative of the differential pressure between the pressure of the load lock chamber and the ambient atmospheric pressure, whereby said modular differential and absolute pressure transducer also outputs the interior door control signal when the first voltage equals an interior door control reference voltage and outputs the exterior door control signal when the second voltage equals an exterior door control reference voltage;

setting the interior door control reference voltage of the modular differential and absolute pressure transducer to a level that equals a voltage that is indicative of the pressure in the load lock chamber when the load lock chamber is evacuated to a pressure at which the interior door is to be opened;

setting the exterior door control reference voltage of the modular differential and absolute pressure transducer to a level that equals a voltage that is indicative of the differential pressure between the pressure of the load lock chamber and the ambient atmospheric pressure at which the exterior door is to be opened;

connecting an interior door control link between the modular differential and absolute pressure transducer and the interior door actuator and connecting an exterior door control link between the modular differential and absolute pressure transducer and the exterior door actuator; and powering the circuitry in the modular differential and absolute pressure transducer to produce the interior door control signal and the exterior door control signal in sequence as the load lock chamber is evacuated and then re-filled with gas such that the modular differential and absolute pressure transducer: (i) provides the interior door control signal to the interior door actuator via the interior door control link to open the interior door; and (ii) provides the exterior door control signal to the exterior door actuator via the exterior door control link to open the exterior door.

2. The method of claim 1, wherein the pirani sensor is a regular pirani sensor.

3. The method of claim 1, wherein the load lock has a throttle that regulates a flow of gas from the load lock chamber and that responds to a throttle control signal, and wherein the modular pressure transducer also outputs a throttle control signal to control the throttle.

4. The method of claim 1, including routing the interior door control signal and the exterior door control signal to the interior door control link and to the exterior control link, respectively, through a common connector on the housing, and connecting the interior door control link and the exterior door control link to the common connector.

5. A method of automatically controlling a load lock that facilitates transfer of parts between a room at ambient atmospheric pressure and a vacuum transfer or processing chamber maintained at a pressure less than one torr and that has an evacuatable load lock chamber, an exterior door positioned between the load lock chamber and the room, a interior door positioned between the load lock chamber and the transfer or processing chamber, a exterior door actuator that is responsive to an exterior door control signal to open or close the exterior door, an interior door actuator that is responsive to an interior door control signal to open or close the interior door, a vacuum pump connected to the load lock chamber for evacuating the load lock chamber, and a throttle, which regulates a flow of gas from the load lock chamber and which is responsive to a throttle control signal, comprising:

connecting a modular differential and absolute pressure transducer in fluid flow relation to the load lock chamber via one fluid flow connection so that a pirani sensor and a differential pressure sensor, both in a housing of the modular differential and absolute pressure transducer, are in fluid flow relation to said load lock chamber via said one connection, said pirani sensor being capable of sensing an absolute pressure in the load lock chamber at least in a range of 100 torr to $10^{31\ 4}$ torr and said differential pressure sensor being capable of sensing a differential pressure between the absolute pressure in the load lock chamber and the ambient atmospheric pressure, and wherein the modular differential and absolute pressure transducer also has circuitry in the housing connected to the pirani sensor and to the differential pressure sensor that is capable of transducing both the absolute pressure sensed by the pirani sensor and the differential pressure sensed by the differential pressure sensor to electric signals indicative of said absolute and differential pressure as well as of outputting: (i) the throttle control signal at a settable intermediate absolute pressure set point; (ii) the interior door control signal at a settable low absolute pressure set point; and (iii) the exterior door control signal at a settable differential pressure setpoint;

setting said intermediate absolute pressure set point at an intermediate absolute pressure value which is less than 100 torr, setting said low absolute pressure set point at a low absolute pressure value which is less than said intermediate absolute pressure and value at which the interior door is to be opened, and setting said differential pressure set point at a differential pressure value at which the exterior door is to be opened;

sensing the absolute pressure in the load lock chamber with the modular pressure transducer at least in the range from 100 torr down to said low absolute pressure value;

using the modular differential and absolute pressure transducer to compare the sensed absolute pressure in the load lock chamber to said intermediate absolute pressure set point in the modular differential and absolute pressure transducer, and, when the sensed absolute pressure in the load lock chamber equals said intermediate absolute pressure set point, producing the throttle control signal with the modular differential and absolute pressure transducer and delivering said throttle control signal to the throttle to increase the rate at which gas in said load lock chamber is removed;

using the modular differential and absolute pressure transducer to compare the sensed absolute pressure in the load lock chamber to said low absolute pressure set point in the modular differential and absolute pressure transducer, and, when the sensed absolute pressure in the load lock chamber equals said low absolute pressure set point, producing the interior door control signal with the modular differential and absolute pressure transducer and delivering the interior door control signal to the interior door actuator to cause the interior door to open;

sensing the differential pressure between the ambient pressure in the room and the pressure in the load lock chamber with the modular differential and absolute pressure transducer; and using the modular differential and absolute pressure transducer to compare the sensed differential pressure to the differential pressure set point, and, when the sensed differential pressure equals the differential pressure set point, producing the exterior door control signal with the modular differential and absolute pressure transducer and delivering the exterior door control signal to the exterior door actuator to cause the exterior door to open.

6. The method of claim 5, wherein the pirani sensor is a regular pirani sensor.

7. The method of claim 5, wherein the transfer or processing chamber is maintained at a pressure of less than $10^{-3}$ torr and the low absolute pressure set point is set at a pressure of less than $10^{-3}$ torr, and sensing the absolute pressure in the load lock chamber with the modular differential and absolute pressure transducer at pressure levels at least from 100 torr to less than $10^{-3}$ torr.

8. The method of claim 5, including using a manifold to make said one fluid flow connection to the load lock chamber so that the pirani sensor and the differential pressure sensor in the modular pressure transducer are both in fluid flow relation to the load lock chamber.

9. A method of controlling a load lock that has an interior door between the load lock and a transfer or processing chamber and that has an interior door actuator that responds to an interior door control signal to open the interior door, a vacuum pump for evacuating the load lock, a throttle that controls a rate of flow of gas from the load lock and that responds to a throttle control signal, and an exterior door for opening and closing the load lock to the ambient atmosphere and an exterior door actuator that responds to an exterior door control signal to open the exterior door, comprising:

providing a modular pressure transducer comprising a housing that contains: (i) both a pirani pressure sensor and a differential pressure sensor in fluid flow relation to a manifold that is also part of the modular pressure transducer, and (ii) a control circuit connected electrically to the pirani sensor and to the differential pressure sensor;

connecting the manifold of the modular pressure transducer to the load lock so that the modular pressure transducer: (i) connects both the pirani pressure sensor and the differential pressure sensor in fluid flow relation to the load lock with one connection of the modular pressure transducer to the load lock;(ii) senses and transduces absolute pressure in the manifold to a first voltage that is indicative of the absolute pressure in the manifold ; (iii) that senses and transduces a differential pressure between the pressure in the manifold and the ambient atmospheric pressure to a second voltage that is indicative of the differential pressure between the pressure in the manifold and the ambient atmospheric pressure; and (iv) outputs the throttle control signal when the first voltage equals a throttle control reference voltage, outputs the interior door control signal when the first voltage equals an interior door control reference voltage, and outputs the exterior door control signal when the second voltage equals an exterior door control reference voltage;

setting the throttle control reference voltage of the modular pressure transducer to a level that equals a voltage that is indicative of an intermediate pressure in the load lock;

setting the interior door control reference voltage of the modular pressure transducer to a level that equals a voltage that is indicative of a low pressure in the load lock at which opening of the interior door is to be actuated;

setting the exterior door control reference voltage of the modular pressure transducer to a level that equals a voltage that is indicative of the differential pressure between the pressure in the load lock and the ambient atmospheric pressure at which opening of the exterior door is to be actuated;

establishing a throttle control link between the modular pressure transducer and the throttle;

establishing an interior door control link between the modular pressure transducer and the interior door actuator;

establishing an exterior door control link between the modular pressure transducer and the exterior door actuator; and powering the modular pressure transducer to produce the throttle control signal, the interior door control signal, and the exterior door control signal in sequence as the load lock is evacuated and then re-filled with gas.

10. The method of claim 9, wherein the low pressure at which the opening of the interior door is to be actuated is less than $10^{-3}$ torr and the modular pressure transducer produces the interior door control signal when it senses said low pressure.

11. The method of claim 9, wherein the low pressure at which the opening of the interior door is to be actuated is in a range between $10^{-3}$ and $10^{-4}$ torr, and wherein the modular pressure transducer senses and generates the interior door control signal at said low pressure.

12. The method of claim 9, wherein the low pressure at which the opening of the interior door is to be actuated is at least as low as $10^{-4}$ torr, and wherein the modular pressure transducer senses when the load lock is evacuated to at least said low pressure and generates the interior door control signal at said low pressure.

13. The method of claim 9, including routing the throttle control signal, the interior door control signal, and the exterior door control signal to the throttle control link, to the interior door control link, and to the exterior door control link, respectively, through a common connector on the housing, and connecting the throttle control link, the interior door control link, and the exterior door control link to the common connector.

14. A method of automatically controlling a load lock that facilitates transfer of parts between a room at ambient atmospheric pressure and a vacuum transfer or processing chamber maintained at a pressure less than one torr and that has an evacuatable load lock chamber, an exterior door positioned between the load lock chamber and the room, a interior door positioned between the load lock chamber and the transfer or processing chamber, a exterior door actuator that is responsive to an exterior door control signal to cause the exterior door to open, an interior door actuator that is responsive to an interior door control signal to cause the interior door to open, and a vacuum pump connected to the load lock chamber for evacuating the load lock chamber, comprising:

providing a modular differential and absolute pressure transducer comprising a housing, which contains circuitry and both an absolute pressure sensor and a differential pressure sensor in fluid flow relation to each; and connecting the absolute pressure sensor and the differential pressure sensor of the modular differential and absolute pressure transducer in fluid flow relation to the load lock chamber via one connection to sense and transduce absolute pressure in the load lock chamber to a first voltage which is indicative of the absolute pressure and to sense and transduce differential pressure between the pressure in the transducer and the ambient atmospheric pressure to a second voltage which is indicative of the differential pressure, and to also output said interior door control signal when the first voltage equals an interior door control reference voltage and output said exterior door control signal when the second voltage equals an exterior door control reference voltage;

setting the interior door control reference voltage of the modular differential and absolute pressure transducer to a level that equals a voltage that is indicative of the absolute pressure in the load lock chamber when the load lock chamber is evacuated to a pressure at which the interior door is to be opened;

setting the exterior door control reference voltage of the modular differential and absolute pressure transducer to a level that equals a voltage that is indicative of the differential pressure between the load lock chamber pressure and the ambient atmospheric pressure at which the exterior door is to be opened;

establishing an interior door control link between the modular differential and absolute pressure transducer and the interior door actuator, and establishing an exterior door control link between the modular differential and absolute pressure transducer and the exterior door actuator; and powering the modular differential and absolute pressure transducer circuitry to produce said interior door control signal to open the interior door and said exterior door control signal to open said exterior door in sequence as the load lock chamber is evacuated and then re-filled with gas.

15. The method of claim 14, wherein the absolute pressure sensor is a pirani sensor.

16. The method of claim 14, including using a manifold to connect the absolute and differential pressure sensors in the modular differential and absolute pressure transducer in fluid flow relation to each other and in fluid flow relation to the load lock chamber.

17. The method of claim 14, wherein the absolute pressure sensor is a pirani sensor.

18. The method of claim 14, wherein the absolute pressure sensor is a convection pirani sensor.

19. The method of claim 14, wherein the absolute pressure sensor is a thermocouple sensor.

20. The method of claim 14, wherein the differential pressure sensor is a capacitance manometer pressure sensor.

21. The method of claim 14, wherein the differential pressure sensor is a piezo pressure sensor.

22. A method of automatically controlling a load lock that facilitates transfer of parts between a room at ambient atmospheric pressure and a vacuum transfer or processing chamber maintained at a pressure less than one torr and that has an evacuatable load lock chamber, an exterior door positioned between the load lock chamber and the room, a interior door positioned between the load lock chamber and the transfer or processing chamber, a exterior door actuator that is responsive to an exterior door control signal to cause the exterior door to open, an interior door actuator that is responsive to an interior door control signal to cause the interior door to open, and a vacuum pump connected to the load lock chamber for evacuating the load lock chamber, comprising:

connecting a modular differential and absolute pressure transducer in fluid flow relation to the load lock chamber via a single fluid flow connection, wherein the modular differential and absolute pressure transducer includes a housing that contains both an absolute pressure sensor, which is capable of sensing absolute pressure in the load lock chamber, and a differential pressure sensor, which is capable of sensing a differential pressure between the load lock chamber pressure and the ambient atmospheric pressure, whereby both said absolute pressure sensor and said differential pressure sensor are in fluid flow relation to said load lock chamber as a result of said single fluid flow connection of the modular pressure transducer to the load lock chamber, said modular differential and absolute pressure transducer also including control circuitry in the housing that is capable of outputting: (i) said interior door control signal at a settable low absolute pressure set point; and (ii) said exterior door control signal at a settable differential pressure set point;

setting a low absolute pressure value in the modular differential and absolute pressure transducer which corresponds to the pressure in the load lock chamber at which the interior door can be opened to allow transfer of the parts between the load lock chamber and the transfer or processing chamber;

setting a differential pressure value in the modular differential and absolute pressure transducer at which to open the exterior door;

using the modular differential and absolute pressure transducer to sense both the absolute pressure in the load lock chamber and the differential pressure between the load lock chamber pressure and the ambient atmospheric pressure;

using the control circuitry in the modular differential and absolute pressure transducer to compare the sensed absolute pressure in the load lock chamber to said low absolute pressure value set in the modular differential and absolute pressure transducer, and, when the sensed absolute pressure in the load lock chamber equals said low absolute pressure value, to generate said interior door control signal, and delivering said interior door control signal to the interior door actuator, which thereby causes the interior door to open; and using the control circuitry in the modular differential and absolute pressure transducer to compare the sensed differential pressure to said differential pressure value, and, when the sensed differential pressure equals said differential pressure value, to generate said exterior door control signal, and delivering said exterior door control signal to the exterior door actuator, which thereby causes the exterior door to open.

23. The method of claim 22, including using a manifold to facilitate connecting said modular differential and absolute pressure transducer to the load lock chamber with both said absolute pressure sensor and said differential pressure sensor in said modular differential and absolute pressure transducer being in fluid flow relation to said manifold.

24. A method of automatically controlling a load lock that facilitates transfer of parts between a room at ambient atmospheric pressure and a vacuum transfer or processing chamber maintained at a pressure less than one torr and that has an evacuatable load lock chamber, an exterior door positioned between the load lock chamber and the room, a interior door positioned between the load lock chamber and the transfer or processing chamber, a exterior door actuator that is responsive to an exterior door control signal to open or close the exterior door, an interior door actuator that is responsive to an interior door control signal to open or close the interior door, a vacuum pump connected to the load lock chamber for evacuating the load lock chamber, and a throttle, which controls a rate at which gas is removed from said load lock chamber and which is responsive to a throttle control signal, comprising:

controlling the throttle, the interior door actuator, and the exterior door actuator with a modular differential and absolute pressure transducer, which comprises a housing that contains an absolute pressure sensor and a differential pressure sensor, and which is connected to the load lock chamber via a single fluid flow connection in a manner that exposes both the absolute pressure sensor and the differential pressure sensor of the modular differential and absolute pressure transducer to pressure in the load lock chamber via said single fluid flow connection to the load lock chamber, said modular differential and absolute pressure transducer also including circuitry in the housing that is capable of producing all of the following: (i) said throttle control signal at a settable first absolute pressure set point; (ii) said interior door control signal at a settable second absolute pressure set point; and (iii) said exterior door control signal at a settable differential pressure setpoint;

setting the first absolute pressure setpoint in the modular differential and absolute pressure transducer;

setting the second absolute pressure setpoint in the modular differential and absolute pressure transducer;

setting the differential pressure setpoint in the modular differential and absolute pressure transducer;

operating the vacuum pump to evacuate the load lock chamber;

sensing the pressure in the load lock chamber with the modular differential and absolute pressure transducer while the load lock chamber is being evacuated, and when the modular differential and absolute pressure transducer senses that the pressure in the load lock chamber has reached the first absolute pressure setpoint, the modular differential and absolute pressure transducer generates said throttle control signal, and when the modular differential and absolute pressure transducer senses that the pressure in the load lock chamber has reached the second absolute pressure setpoint, the modular differential and absolute pressure transducer generates said interior door control signal to activate said interior door actuator; and refilling the load lock chamber and thereby increasing the pressure in the load lock chamber while sensing the differential pressure between the load lock chamber pressure and the ambient atmospheric pressure with the modular differential and absolute pressure transducer, and when the modular differential and absolute pressure transducer senses that the pressure in the load lock chamber has reached the differential pressure setpoint, the modular pressure transducer generates said exterior door control signal to activate said exterior door actuator.

25. The method of claim 24, including making said single fluid flow connection to the load lock chamber with a connector that also supports the modular pressure transducer, including both the absolute and differential pressure sensors and the circuitry, on the load lock.

26. The method of claim 24, wherein the absolute pressure sensor is a regular pirani sensor.

27. The method of claim 24, wherein the absolute pressure sensor is a convection pirani sensor.

28. The method of claim 24, wherein the differential pressure sensor is a piezo pressure sensor.

29. The method of claim 24, wherein the absolute pressure sensor is a thermocouple sensor.

30. The method of claim 24, wherein the absolute pressure sensor is a pirani sensor.

31. The method of claim 24, wherein the absolute pressure sensor is capable of measuring absolute pressure at least from 100 torr to $10^{-4}$ torr.

32. The method of claim 24, wherein the differential pressure sensor is a capacitance manometer pressure sensor.

33. A method of automatically controlling a load lock that facilitates transfer of parts between a room at ambient atmospheric pressure and a vacuum transfer or processing chamber maintained at a pressure less than one torr and that has an evacuatable load lock chamber, an exterior door positioned between the load lock chamber and the room, a interior door positioned between the load lock chamber and the transfer or processing chamber, a exterior door actuator that is responsive to an exterior door control signal to open or close the exterior door, an interior door actuator that is responsive to an interior door control signal to open or close the interior door, a vacuum pump connected to the load lock chamber for evacuating the load lock chamber, comprising:

controlling the interior door actuator and the exterior door actuator with a modular pressure transducer, which comprises a housing that contains an absolute pressure sensor and a differential pressure sensor, and which is connected to the load lock chamber via a single fluid flow connection in a manner that exposes both the absolute pressure sensor and the differential pressure sensor of the modular differential and absolute pressure transducer to pressure in the load lock chamber via said single connection to the load lock chamber, said modular differential and absolute pressure transducer also including circuitry in the housing that is capable of generating said interior door control signal at a settable absolute pressure set point and said exterior door control signal at a settable differential pressure setpoint;

setting the absolute pressure setpoint in the modular differential and absolute pressure transducer;

setting the differential pressure setpoint in the modular differential and absolute pressure transducer;

operating the vacuum pump to evacuate the load lock chamber;

sensing the pressure in the load lock chamber with the modular differential and absolute pressure transducer while the load lock chamber is being evacuated, and when said modular differential and absolute pressure transducer senses that the pressure in the load lock chamber has reached said absolute pressure setpoint, the modular differential and absolute pressure transducer generates said interior door control signal to activate said interior door actuator; and refilling the load lock chamber and thereby increasing the pressure in the load lock chamber while sensing differential pressure between the load lock chamber pressure and the ambient atmospheric pressure with the modular differential and absolute pressure transducer, and when said modular differential and absolute pressure transducer senses that the pressure in the load lock chamber has reached the differential pressure setpoint, the modular pressure transducer generates said exterior door control signal to activate said exterior door actuator.

34. A method of automatically controlling a load lock that facilitates transfer of parts between a room at ambient atmospheric pressure and a vacuum transfer or processing chamber maintained at a pressure less than one torr and that has an evacuatable load lock chamber, an exterior door positioned between the load lock chamber and the room, a interior door positioned between the load lock chamber and the transfer or processing chamber, a exterior door actuator that is responsive to an exterior door control signal to open or close the exterior door, an interior door actuator that is responsive to an interior door control signal to open or close the interior door, a vacuum pump connected to the load lock chamber for evacuating the load lock chamber, and a throttle, which is responsive to a throttle control signal, comprising:
controlling the throttle and the exterior door actuator with a modular pressure transducer, which comprises a housing that contains an absolute pressure sensor and a differential pressure sensor, and which is connected to the load lock chamber with a single fluid flow connection in a manner that exposes both the absolute pressure sensor and the differential pressure sensor in the modular differential and absolute pressure transducer to pressure in the load lock chamber via said single fluid flow connection to the load lock chamber, said modular differential and absolute pressure transducer also including circuitry in the housing that is capable of generating both said throttle control signal at a settable first absolute pressure set point and said exterior door control signal at a settable differential pressure setpoint;
setting the first absolute pressure setpoint in the modular pressure transducer;
setting the differential pressure setpoint in the modular pressure transducer;
operating the vacuum pump to evacuate the load lock chamber;
sensing the pressure in the load lock chamber with the modular pressure transducer while the load lock chamber is being evacuated, and when said modular differential and absolute pressure transducer senses that the pressure in the load lock chamber has reached the first absolute pressure setpoint, the modular pressure transducer generates said throttle control signal; and
refilling the load lock chamber and thereby increasing the pressure in the load lock chamber while sensing differential pressure between the load lock chamber pressure and the ambient atmospheric pressure with the modular pressure transducer, and when said modular differential and absolute pressure transducer senses that the pressure in the load lock chamber has reached the differential pressure setpoint, the modular pressure transducer generates said exterior door control signal to activate said exterior door actuator.

35. The method of claim 34, including also controlling the interior door actuator with the modular pressure transducer by setting a second absolute pressure setpoint in the modular pressure transducer lower than said first absolute pressure setpoint, and continuing to sense the pressure in the load lock chamber with the modular pressure transducer as said vacuum pump continues to evacuate the load lock chamber after the first absolute pressure setpoint is reached, and when said modular differential and absolute pressure transducer senses that the pressure in the load lock chamber has reached said second absolute pressure setpoint, the modular pressure transducer generates said interior door control signal.

36. A method of automatically controlling a load lock that facilitates transfer of parts between a room at ambient atmospheric pressure and a vacuum transfer or processing chamber maintained at a pressure less than one torr and that has an evacuatable load lock chamber, an exterior door positioned between the load lock chamber and the room, a interior door positioned between the load lock chamber and the transfer or processing chamber, a exterior door actuator that is responsive to an exterior door control signal to open or close the exterior door, an interior door actuator that is responsive to an interior door control signal to open or close the interior door, a vacuum pump connected to the load lock chamber for evacuating the load lock chamber, comprising:
mounting an absolute pressure sensor and a differential pressure sensor along with electric circuitry together in a housing to provide a modular differential and absolute pressure transducer, which is capable of transducing electric signals from the absolute and differential pressure sensors to generate said interior door control signal and said exterior door control signal at respective absolute pressure and differential pressure setpoints, and making a single fluid flow connection of the modular pressure transducer with the load lock chamber to expose both the absolute and differential pressure sensors in the modular pressure transducer to a pressure in the load lock chamber via said single connection;
operating the vacuum pump to evacuate the load lock chamber while sensing the pressure in the load lock chamber with the absolute pressure sensor in said modular pressure transducer so that, upon sensing that the pressure in the load lock chamber is at least down to the absolute pressure setpoint, the circuitry in the modular differential and absolute pressure transducer generates and transmits said interior door control signal to the interior door actuator to cause the interior door to be opened; and
back-filling the load lock chamber with gas to increase the pressure in the load lock chamber while sensing the differential pressure between the load lock chamber pressure and the ambient atmospheric pressure with the modular differential and absolute pressure transducer so that, upon back-filling the load lock chamber with at least enough gas to reach said differential pressure setpoint, the circuitry in the modular differential and absolute pressure transducer generates and transmits said exterior door control signal to the exterior door actuator to cause the exterior door to be opened.

37. A method of automatically controlling a load lock that facilitates transfer of parts between a room at ambient atmospheric pressure and a vacuum transfer or processing chamber maintained at a pressure less than one torr and that has an evacuatable load lock chamber, an exterior door positioned between the load lock chamber and the room, a interior door positioned between the load lock chamber and the transfer or processing chamber, a exterior door actuator that is responsive to an exterior door control signal to open or close the exterior door, an interior door actuator that is responsive to an interior door control signal to open or close the interior door, a vacuum pump connected to the load lock chamber for evacuating the load lock chamber, comprising:

controlling the interior door actuator and the exterior door actuator with a modular pressure transducer, which comprises a housing that contains an absolute pressure sensor and a differential pressure sensor, and which is connected to the load lock chamber with a single fluid flow connection in a manner that exposes both the absolute pressure sensor and the differential pressure sensor in the pressure transducer to pressure in the load lock chamber via said single connection to the load lock chamber, said modular pressure transducer also including electric circuitry in the housing that is capable of generating: (i) said interior door control signal at a absolute pressure setpoint that is set at a absolute pressure value at which the interior door is to be opened; and (ii) said exterior door control signal at a differential pressure setpoint that is set at a differential pressure value at which the exterior door is to be opened;

sensing the pressure in the load lock chamber with the modular pressure transducer while operating the vacuum pump to evacuate the load lock chamber at least to the absolute pressure setpoint, whereupon after sensing that the load lock chamber pressure has reached said absolute pressure set point, the modular pressure transducer generates said interior door control signal to cause said interior door to be opened; and sensing the differential pressure between the load lock chamber pressure and the ambient atmospheric pressure with the modular differential and absolute pressure transducer while refilling the load lock chamber with gas or air and thereby increasing the pressure in the load lock chamber at least until the differential pressure reaches the differential pressure setpoint, whereupon the pressure transducer generates said exterior door control signal to cause said exterior door to be opened.

* * * * *

UNITED STATES PATENT AND TRADEMARK OFFICE
CERTIFICATE OF CORRECTION

| | | |
|---|---|---|
| PATENT NO. | : 7,076,920 B2 | Page 1 of 1 |
| APPLICATION NO. | : 09/815376 | |
| DATED | : July 18, 2006 | |
| INVENTOR(S) | : Garry Holcomb et al. | |

It is certified that error appears in the above-identified patent and that said Letters Patent is hereby corrected as shown below:

On the Title page of the patent, please insert the following line:

Item [60] --Related U.S. Application Data: Provisional application No. 60/191,223, filed on March 22, 2000.--

Column 1, line 1, insert the following paragraph:

--Cross-Reference to Related Applications:
 The present application claims priority to U.S. Provisional Application No. 60/191,223, filed March 22, 2000.--

Signed and Sealed this

Eighth Day of July, 2008

JON W. DUDAS
*Director of the United States Patent and Trademark Office*